(12) United States Patent
Lin et al.

(10) Patent No.: US 8,853,002 B2
(45) Date of Patent: Oct. 7, 2014

(54) METHODS FOR METAL BUMP DIE ASSEMBLY

(71) Applicant: Taiwan Semiconductor Manufacturing Company, Ltd., Hsin-Chu (TW)

(72) Inventors: Hsiu-Jen Lin, Zhubei (TW); Ai-Tee Ang, Hsin-Chu (TW); Yu-Jen Tseng, Hsin-Chu (TW); Yu-Peng Tsai, Taipei (TW); Ming-Da Cheng, Jhubei (TW); Chung-Shi Liu, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 13/734,644

(22) Filed: Jan. 4, 2013

(65) Prior Publication Data

US 2014/0193952 A1    Jul. 10, 2014

(51) Int. Cl.
*H01L 21/00* (2006.01)
*H01L 23/00* (2006.01)

(52) U.S. Cl.
CPC ..................................... *H01L 24/81* (2013.01)
USPC .......................................................... 438/108

(58) Field of Classification Search
None
See application file for complete search history.

(56) References Cited

U.S. PATENT DOCUMENTS

| | | | |
|---|---|---|---|
| 3,283,124 A * | 11/1966 | Kawecki ........................ 392/419 |
| 3,710,069 A * | 1/1973 | Papadopoulos et al. ... 219/85.12 |
| 5,278,938 A * | 1/1994 | Spigarelli et al. ............. 392/420 |
| 6,513,701 B2 * | 2/2003 | Mead et al. ................ 228/248.1 |
| 6,548,330 B1 | 4/2003 | Murayama et al. |
| 6,696,764 B2 | 2/2004 | Honda |
| 6,933,173 B2 | 8/2005 | Yunus |
| 7,041,531 B2 | 5/2006 | Wang |
| 7,407,878 B2 * | 8/2008 | Li ................................. 438/614 |
| 7,790,597 B2 * | 9/2010 | Chauhan et al. .............. 438/613 |
| 8,440,503 B1 | 5/2013 | Lin et al. |
| 2002/0053745 A1 | 5/2002 | Lin |
| 2002/0064930 A1 * | 5/2002 | Ishikawa ....................... 438/612 |
| 2004/0028113 A1 * | 2/2004 | Schlagheck et al. ............ 374/57 |
| 2005/0009237 A1 | 1/2005 | Yamaguchi |
| 2008/0003715 A1 * | 1/2008 | Lee et al. ...................... 438/108 |
| 2010/0227170 A1 | 9/2010 | Endo et al. |

OTHER PUBLICATIONS

Lee, M., et al., "Study of Interconnection Process for Fine Pitch Flip Chip," 2009 Electronic Components and Technology Conference, RCTC 2009, 59th, May 26-29, 2009, pp. 720-723.

* cited by examiner

*Primary Examiner* — Scott B Geyer
(74) *Attorney, Agent, or Firm* — Slater & Matsil, L.L.P.

(57) ABSTRACT

Methods for assembling metal bump dies. In an embodiment, a method includes providing an integrated circuit die having a plurality of conductive terminals; depositing solder to form solder depositions on the conductive terminals; providing a substrate having a die attach region on a surface for receiving the integrated circuit die, the substrate having a plurality of conductive traces formed in the die attach region; aligning the integrated circuit die and the substrate and bringing the plurality of conductive terminals and the conductive traces into contact, so that the solder depositions physically contact the conductive traces; and selectively heating the integrated circuit die and the conductive terminals to a temperature sufficient to cause the solder depositions to melt and reflow, forming solder connections between the conductive traces on the substrate and the conductive terminals on the integrated circuit die. Various energy sources are disclosed for the selective heating.

20 Claims, 3 Drawing Sheets

METHODS FOR METAL BUMP DIE ASSEMBLY

TECHNICAL FIELD

The present invention relates generally to integrated circuit packaging where an integrated circuit die is mounted to a substrate, and more specifically to an integrated circuit die mounted to a substrate in flip chip orientation.

BACKGROUND

Flip chip mounting of integrated circuit dies on substrates is increasingly used. In one approach, metal bump conductors are formed on the bond pads of an integrated circuit die, the metal bump conductors are arranged for flip chip mounting. Conductive traces are formed on the substrate. Solder is disposed on a portion of the metal bump conductors. The die and metal bump conductors are placed face down ("flipped") so that the solder contacts the metal traces on the substrate. A thermal reflow process is used that causes the solder to melt and reflow, forming an electrical and physical connection between the metal bump conductors and the substrate. The substrate may be used for a ball grid array package by placing balls on the opposite surface of the substrate.

Because a thermal reflow process is used to reflow the solder, the substrate and the die are subjected to heating. However, as the pitch between the metal traces on the substrate becomes smaller ("fine pitch") with advances in semiconductor processing, problems can arise when the substrate is heated. Substrate expansion can occur, causing the metal traces to move during the reflow process and solder may form bridging shorts between the traces. The substrate may contract when cooled and cold solder joints or opens may occur. The solder may crack and cause opens.

BRIEF DESCRIPTION OF THE DRAWINGS

For a more complete understanding of the present invention, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the embodiments and are not necessarily drawn to scale.

DETAILED DESCRIPTION OF ILLUSTRATIVE EMBODIMENTS

The making and using of example illustrative embodiments are discussed in detail below. It should be appreciated, however, that the embodiments provide many applicable inventive concepts that can be embodied in a wide variety of specific contexts. The specific embodiments discussed are merely illustrative of specific ways to make and use the various embodiments, and do not limit the scope of the specification, or the appended claims.

Figure 1:
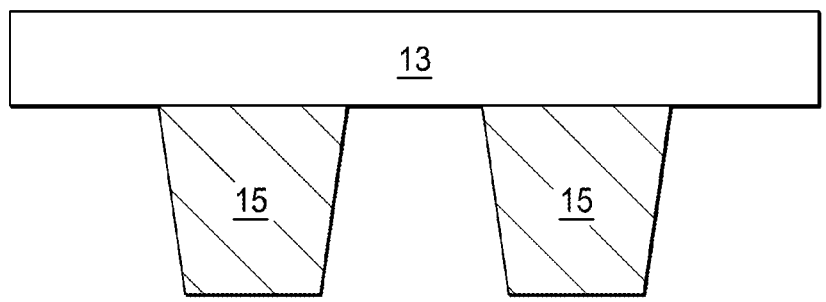
FIG. 1 illustrates in a cross sectional view an integrated circuit for use with an embodiment.

FIG. 1 illustrates in a simplified cross-sectional view, an integrated circuit 11 that includes a semiconductor die 13 and conductive terminals 15. The conductive terminals 15 are formed on bond pads (not shown) that couple the conductive terminals 15 electrically to devices formed within the semiconductor die 13. The devices in the semiconductor die 13 can include, without limitation, passive devices such as resistors, capacitors, inductors and active devices such as transistors, as well as functional units formed of many transistors such as non-volatile or volatile memory arrays, signal processors, analog to digital converters, microprocessors, controllers and the like, to perform some predetermined function.

In FIG. 1, the die 13 may be any integrated circuit die and in an embodiment was formed on a semiconductor substrate, or wafer, as one of many integrated circuits, which were then singulated or separated from each other to form individual dies after wafer processing is completed. The die 13 may be formed on a silicon, germanium, gallium arsenide or other semiconductor material. The conductive terminals 15 are, in one embodiment, an electroplated metal material. In one embodiment, copper is used, although gold, nickel, palladium, silver and alloys of these metals could be used. Plating layers such as ENIG (electroplated nickel immersion gold) and ENEPIG (electroplated nickel, electroplated palladium, immersion gold) are used as surface treatments on the conductive terminals in alternative embodiments. Plating layers provide increased adhesion and reduce corrosion and diffusion of the copper in the conductive terminals 15.

In the example embodiment, the shape of the conductive terminals 15 form "ladder bumps". A ladder bump has a wider width at the base portion adjacent the die 13, and a smaller width at the exposed surface away from the die 13, with tapering sidewalls. In cross section, the ladder bumps appear as a "ladder" shape. In alternative embodiments, the conductive terminals can be columns, pillars and may be circular, rectangular or oval in shape. A trapezoidal shape may be used. The conductive terminals 15 may be formed, in one embodiment, using electrochemical plating (ECP). In ECP, a seed layer of copper, for example, may be sputtered or otherwise disposed a wafer that includes many dies such as die 13. A photolithographic process may be used to form a patterned mask layer over the seed layer with openings corresponding to the bond pads. A plating bath including copper in an acid solution is provided, the wafer is submerged in the plating bath and a current is applied. A sacrificial terminal forms an anode or cathode, and the wafer forms the cathode or anode, and copper ions are drawn to the wafer and form a copper layer by electro plating on the copper seed layer on each bond pad. Polishing or etch processing can remove the excess copper and the mask or photoresist layer can be removed, leaving the conductive terminals 15. In one embodiment, copper conductive terminals are formed.

Figure 2:
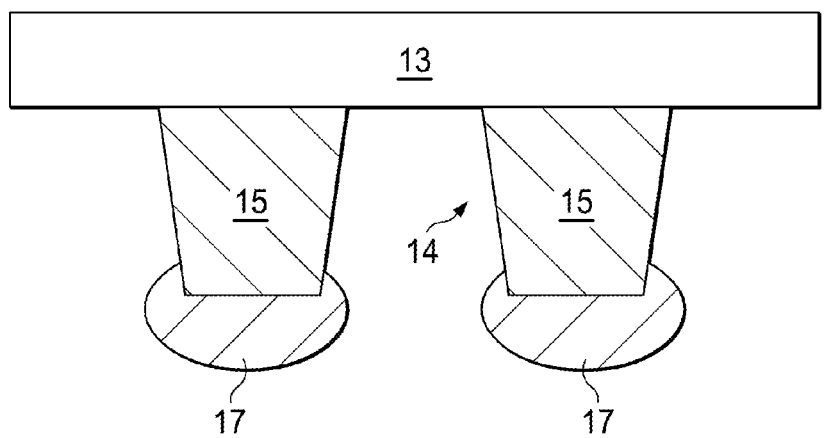
FIG. 2 illustrates in a cross sectional view the integrated circuit of FIG. 1 following an additional process step of the embodiments.

FIG. 2 depicts, in a cross sectional view, the integrated circuit 11 after solder deposits 17 are applied. The solder may form deposits of any shape, in one alternative solder bumps or balls may be formed. In an embodiment, the solder is applied by a plating method. In alternative embodiments, the solder deposits 17 may be applied by screen printing or dipping In an embodiment, the solder deposits 17 may be formed from lead free solder materials. The use of lead free solder is increasing and includes compositions that are eutectic, that is, have a common melting point. For example, in an embodiment, the solder deposits 17 may be lead-free solder material such as tin, silver, copper (Sn—AgCu or SAC) or other lead free materials. The solder deposits 17 are, in another embodiment, a lead based solder material such as Pn-Sn. In addition, in an embodiment, an oxide 14 may be formed on the portions of the conductive terminals 15 that are not covered by the solder material. For example, in an embodiment where the conductive terminals 15 are copper, the oxide 14 may be copper oxide (CuO). Copper oxide 14 may be formed during wafer annealing, for example.

Figure 3:
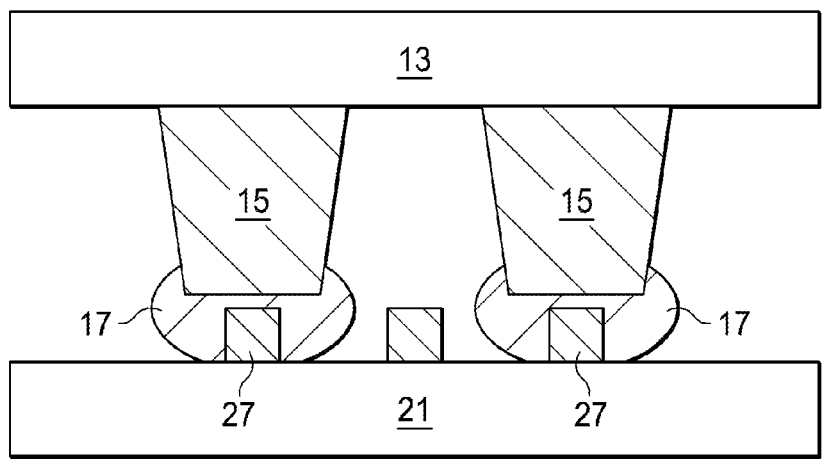
FIG. 3 illustrates in a cross-sectional view an example illustrative embodiment.

FIG. 3 depicts, in another cross sectional view, the integrated circuit 11 with die 13 and conductive terminals 15 after die assembly where the die 13 is flip chip mounted to a substrate 21. The substrate 21 may be formed of any of several substrate materials used in semiconductor packaging with flip chip die assemblies. In one embodiment, the substrate 21 is silicon, for example. The substrate 21 may be a semiconductor wafer, in another example embodiment. Substrate 21 is, in one alternative embodiment, based on an insulating core such as a fiberglass reinforced resin core. One example core material is fiberglass resin such as FR4. Alternatives for the core material include bismaleimide-triazine (BT) resin, or alternatively, other PC board materials or films. Build up films such as Ajinomoto build-up film (ABF) or other laminates may be used for substrate 21.

Traces 27 are formed on substrate 21. The substrate 21 may, in one embodiment, form a ball grid array (BGA) package substrate, and in that example, additional traces would be formed on the bottom side (not shown here, for simplicity) and solder bumps or balls would be formed on the bottom side of substrate 21 (again, not shown in FIG. 3). Through vias may be formed in substrate 21, to couple the traces 27 to traces on the bottom side. Traces 27 are increasingly "fine pitch", that is, as the dies 13 become smaller and the number of conductive terminals remains large, the pitch or distance between the terminals 15 is reduced. The traces 27 therefore also have a reduced pitch, as the traces 27 will be aligned to the conductive terminals 15 to make the electrical connections to the die 13.

The solder 17 is used to electrically connect the conductive terminals 15 to the traces 27. This solder connection is formed in a thermal reflow process. In a conventional approach, the die 13, with conductive terminals 15 aligned to and placed in contact with the traces 27 on substrate 21, is placed in a chamber and convection heating is used. The heat is applied to achieve a temperature that is high enough so that the solder 17 will reach a melting point and reflow, forming the solder connections between the conductive traces 27 and the conductor terminals 15. Traces 27, which may be copper, gold, aluminum, nickel or alloys of these, and which may be plated with nickel, gold, palladium and the like to promote solder adhesion, for example, are necessarily also heated with substrate 21 in a convection heating process. In a conventional heating approach, the substrate 21 can expand, causing misalignment or movement during the thermal reflow, and the solder from solder deposits 17 may begin bridging between the traces 27, forming shorts. If the substrate 21 then contracts after the reflow is complete, the solder joints may be cracked during the cooling after the thermal reflow, causing opens either immediately, or perhaps later in the field.

Figure 4:
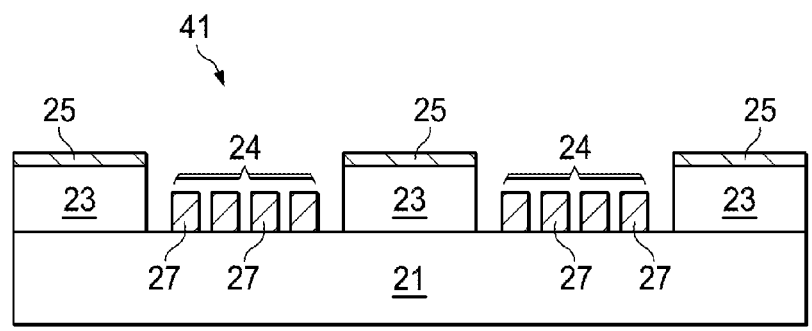
FIG. 4 illustrates in a cross-sectional view a portion of a substrate for use with the embodiments.

FIG. 4 depicts, in a cross sectional view, a substrate 21 with a cover 23 and a reflective coating 25 for use in an embodiment. In FIG. 4, the substrate 21 has multiple die attach openings 24 for receiving integrated circuits. In a wafer scale process, many dies may be processed simultaneously on substrate 21, which is then diced or singulated into smaller portions to complete the integrated circuit packages. In each die attach position 24, traces 27 are shown. Flux may be applied to the traces 27 before the reflow processes described below. For areas on the surface of substrate 21 where no integrated circuit die will be placed, a cover material 23, which may be a passivation layer material, for example, is formed. As is described below, the use of the cover 23 and the reflective coating 25 on the portions of substrate 21 that are not die attach positions enable novel methods for selective heating for a thermal reflow process. In the methods, heating is applied to the die 13 and the conductive terminals 15, sufficient to provide a reflow process for solder deposits 17, but without heating the substrate 21, thereby preventing the adverse thermal effects experienced in the prior approaches.

Figure 5:
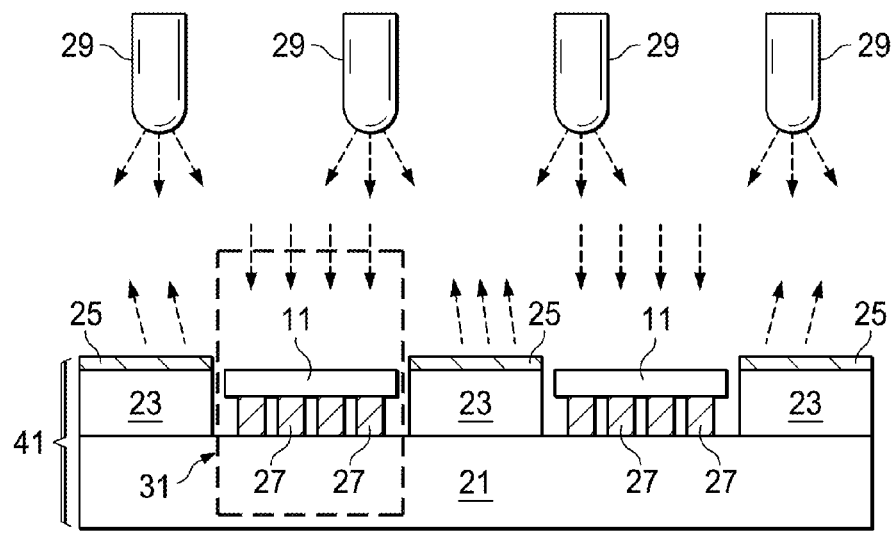
FIG. 5 illustrates in a cross sectional view an embodiment thermal reflow process.

FIG. 5 depicts, in a cross sectional view, a process for heating the assembly 41 of FIG. 4 with substrate 21, cover material 23 overlying a portion of substrate 21, integrated circuits 11 positioned in the open portions of material 23 with reflective layer 25. In the process illustrated in FIG. 5, infrared (IR) sources 29 are used to apply heat to the integrated circuits 11. IR sources 29 may be IR lamps, for example, in a process chamber. Reflective coatings 25 over the cover material 23 cause the IR energy to reflect as shown, and prevent substrate 21 from heating. Reflective material 25 on cover 23 is selected to be highly reflective to IR energy and in various embodiments, may be a metal such as silver (Ag), gold (Au), copper (Cu), aluminum (Al), tin (Sn), iron (Fe), alloys of these, multiple layers of these may be used, and reflective oxides such as aluminum oxide (Al2O3) may be used. In this embodiment, the integrated circuits 11 and thus the conductive terminals 15 with solder deposits 17 are heated, while the substrate 21, which is covered either by the integrated circuits 11, or by the reflective coatings 25, is not heated. Thus, during the thermal reflow process, the substrate is at a far lower temperature than the integrated circuits 11, and will not experience the thermal effects of the thermal reflow. The integrated circuits 11 are selectively heated by the process as shown in area 31, and the solder then melts onto traces 27 and forms bump on trace connections between the conductive terminals 15, which may in one embodiment be copper ladder bumps, for example, and the traces 27.

In an example embodiment selective heating thermal reflow process, the integrated circuits 11 including the dies 13 and the conductive terminals 15 were heated to a temperature of around 300 degrees Celsius, while the substrate 21 remained at a temperature of less than 180 degrees Celsius.

Figure 6:
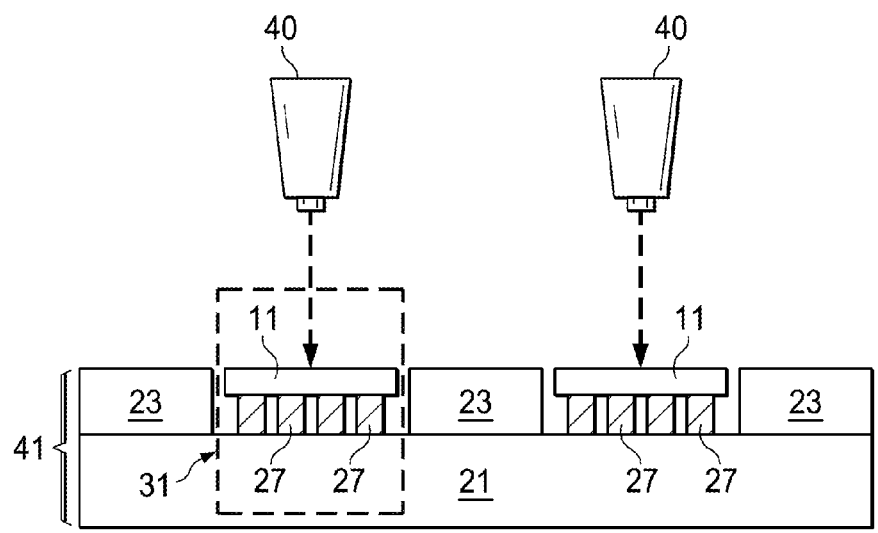
FIG. 6 illustrates in a cross sectional view another alternative embodiment thermal reflow process.

FIG. 6 depicts, in a cross sectional view, in an alternative embodiment, a thermal reflow process being performed on integrated circuits 11 and substrate 21 using multiple laser sources 40. Each laser source 40 provides laser energy to the integrated circuits 11 and by using the multiple lasers 40, each integrated circuit 11 is simultaneously processed for the thermal reflow processing, so that throughput is the same as for the method of FIG. 5 using the IR sources. The laser energy from lasers 40 are not applied to the substrate covers 23, thus the reflective coatings applied in the embodiments above are not needed. Again, the integrated circuits 11 are heated to a temperature sufficient to cause the solder to reflow on traces 27. In an embodiment, this was, for example, a temperature of greater than 300 degrees Celsius. The substrate 21 is not heated and will not reach a temperature of greater than 180 degrees Celsius.

Figure 7:
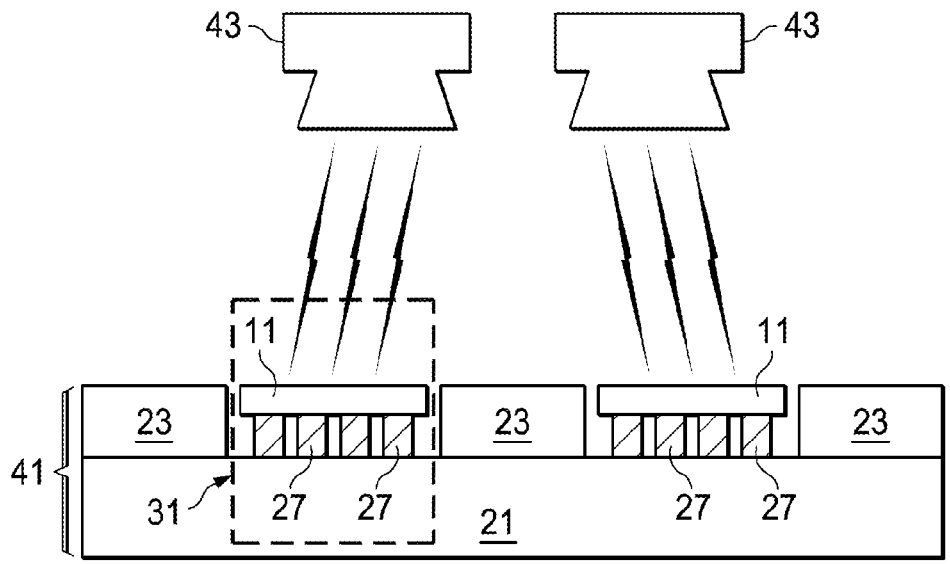
FIG. 7 illustrates in a cross sectional view an alternative embodiment thermal reflow process.

FIG. 7 depicts, in another alternative embodiment, a cross section depicting a thermal reflow process being performed on integrated circuits 11 and substrate 21 using radio frequency (RF) energy sources 43 to provide RF heating. In RF heating, an alternating field is applied at a radio frequency, for example in one non-limiting embodiment a frequency of about $10^5$ Ghz is used, and molecules in the materials change magnetic direction according to the RF field; the friction forces between the moving molecules then heats the material. In an example embodiment that is non limiting, an RF frequency of $10^5$ Ghz is used. Because different materials heat at different rates in RF heating, selective heating may be performed. In FIG. 7, the RF energy is selected to cause the integrated circuits 11 to heat, and not the substrate 21. Covers 23 are again used to isolate substrate 21 from the RF energy sources 43. The integrated circuits 11 will be heated to a temperature of around or over 300 degrees Celsius, to insure the solder (not visible) will reflow onto the traces 27 on substrate 21, however, the substrate 21 will not be heated to above 180 degrees Celsius. The selective heating of the embodiments thus performs thermal reflow of the solder efficiently to complete the die assembly to the substrate, while also preventing the substrate thermal expansion and the associate solder bridging problems observed in the prior art.

Figure 8:
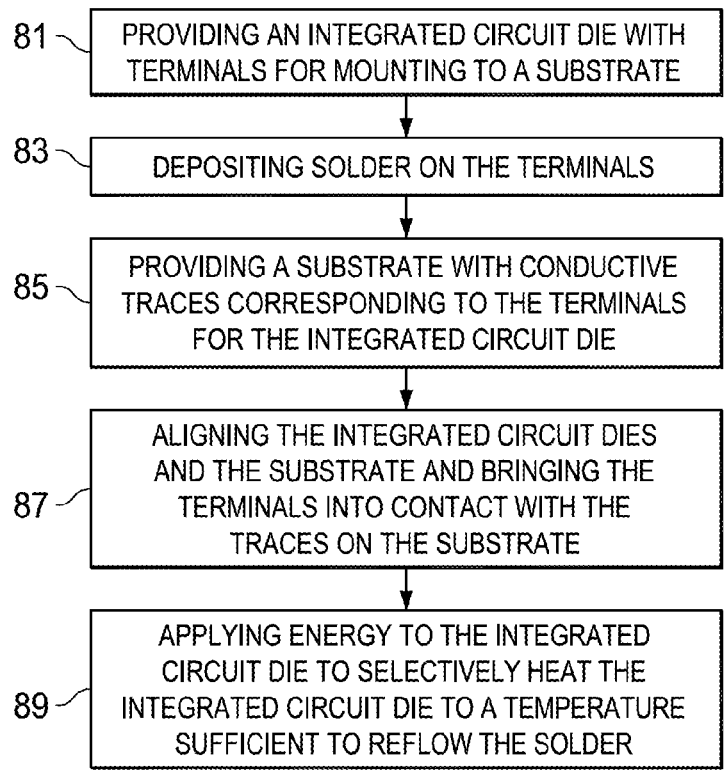
FIG. 8 illustrates in a flow diagram a method embodiment.

FIG. 8 depicts in a simplified flow chart a method embodiment for selective heating of the integrated circuits during a thermal reflow process. In FIG. 8, at step 81, the integrated circuit die is provided with terminals for mounting to a substrate. As described above, the terminals may be copper and may be copper ladder bumps, copper pillars, copper columns or other shapes. The terminals may be formed of other materials, and in one embodiment, are electroplated using ECP processes. Copper stud bumps and stacks of stud bumps may be used.

At step 83, the integrated circuit die is prepared for the thermal reflow die assembly process by deposition of solder on the terminals. As described above, the solder may be formed only on a portion of the terminals, such as the "bottom" portion (farthest portion from the integrated circuit die). An oxide such as CuO may form on the sides of the conductive terminals.

At step 85, the substrate is provided for the die assembly process. The substrate has conductive traces on the die side surface for receiving the conductive terminals for the one or more integrated circuit dies.

At step 87, the integrated circuit dies and the substrate are aligned and brought into contact so that the solder on the conductive terminals and the traces are brought into physical contact. The die assembly process may be said to be a "bump on trace" process, in this example, when copper "bumps" on the integrated circuit die are attached to the substrate traces.

At step 89, energy is applied to selectively heat the integrated circuit die to a temperature that is sufficient to cause the solder on the conductive terminals to reflow onto the copper traces. The integrated circuit die is heated to a temperature of around 300 degrees Celsius or more, while the substrate is not heated and remains at a temperature of less than 180 degrees Celsius. As described above, in one embodiment, the selective heating uses infrared energy such as IR lamps. In another embodiment, the integrated circuit dies are heated by the use of individual lasers corresponding to each integrated circuit die. In yet another embodiment, the integrated circuit dies are heated by the use of RF energy.

Use of the embodiment methods with selective heating of the integrated circuit dies to reflow the solder reduces or avoids entirely the solder bridging and solder cracking problems in the die assembly process that occur in conventional thermal reflow processing. The use of the embodiments provides fine pitch substrates for bump on trace mounting of flip chip integrated circuit dies with excellent yield and process throughput, reducing costs.

In an embodiment, a method includes providing an integrated circuit die having a plurality of conductive terminals extending from a surface, the plurality of conductive terminals disposed on bond pads and providing electrical connection to one or more devices within the integrated circuit die; depositing solder to form solder depositions on the conductive terminals; providing a substrate having a die attach region on a surface for receiving the integrated circuit die, the substrate having a plurality of conductive traces formed in the die attach region and the conductive traces corresponding to the conductive terminals; aligning the integrated circuit die and the substrate and bringing the plurality of conductive terminals and the conductive traces into contact, so that the solder depositions physically contact the conductive traces; and selectively heating the integrated circuit die and the conductive terminals to a temperature sufficient to cause the solder depositions to melt and reflow, forming solder connections between the conductive traces on the substrate and the conductive terminals on the integrated circuit die.

In another embodiment, the method above includes during the selectively heating, the integrated circuit die reaches a temperature of at least 300 degrees Celsius. In another embodiment, the method includes wherein during the selectively heating, the substrate does not exceed a temperature of 180 degrees Celsius. In still another embodiment, in the methods during the selectively heating, infrared energy is applied to the integrated circuit die. In yet another embodiment, during the selectively heating, laser energy is applied to the integrated circuit die. In still a further embodiment, in the above method, during the selectively heating, radio frequency energy is applied to the integrated circuit die. In another embodiment in the above methods providing an integrated circuit die having a plurality of conductive terminals extending from a surface further includes forming copper ladder bumps on the bond pads of the integrated circuit die. In still another alternative embodiment, providing an integrated circuit die having a plurality of conductive terminals extending from a surface further includes forming metal pillar bumps on the bond pads of the integrated circuit die. In still another embodiment, in the above methods, providing a substrate having a die attach region on a surface for receiving the integrated circuit die includes providing the substrate having a plurality of conductive traces formed in the die attach region, and forming cover material over the substrate in portions outside the die attach regions. In yet another embodiment, the methods further include disposing a reflective coating over the cover material over the substrate, the reflective coating comprising a metal.

In another embodiment, a method includes providing a substrate core having a plurality of die attach regions on a die side surface each for receiving an integrated circuit, and having regions outside the die attach regions; forming conductive traces on the substrate core, the conductive traces exposed in the die attach regions for coupling to conductive terminals of an integrated circuit die to be flip chip mounted in each die attach region; providing a plurality of integrated circuit dies, each having a plurality of conductive terminals for flip chip mounting to the substrate core, each conductive terminal having solder deposited on at least an end portion; aligning an integrated circuit die of the plurality of integrated circuit dies with each die attach region on the substrate, and bringing the solder deposited on the end portion of the conductive terminals into physical contact with the conductive traces; and performing a thermal reflow of the solder deposits by selectively heating the plurality of integrated circuit dies to a temperature sufficient to melt the solder deposits, without heating the substrate above a temperature of 180 degrees Celsius. In still another embodiment, in the above methods, the selectively heating includes exposing the integrated circuit dies to an energy source selected from the group consisting essentially of infrared, laser, and radio frequency energy sources. In still a further embodiment, in the above methods, providing the substrate core having a plurality of die attach regions on the die side surface further includes providing cover material on the die side surface of the substrate outside of the die attach regions. In yet a further embodiment, reflective material is formed on the cover material. In yet another embodiment, in the above methods, performing the selectively heating includes exposing the integrated circuit dies to infrared energy sources.

In another alternative embodiment, a method includes providing a plurality of integrated circuit dies; forming conductive terminals on each of the integrated circuit dies; forming a solder deposit on an least an end portion of the conductive terminals of each of the integrated circuit dies; providing a substrate having die attach regions for flip chip mounting of the integrated circuit dies to a die side of the substrate, and having conductive traces disposed in the die attach regions and corresponding to the conductive terminals of the integrated circuit dies, and having cover material over the die side of the substrate outside of the die attach regions; and mounting an integrated circuit die in each of the die attach regions by disposing one of the plurality of integrated circuit dies in each die attach region, bringing the solder deposits into contact with the conductive traces and selectively heating the integrated circuit dies to melt the solder deposits, forming an electrical connection and a physical solder connection between the conductive terminals and the conductive traces. In still a further embodiment, the method includes selectively heating comprises exposing the integrated circuit dies to an energy source that is one selected from the group consisting essentially of infrared, laser and radio frequency energy sources. In still another embodiment, the method includes forming the conductive terminals comprise forming copper ladder bumps. In still another embodiment, the method includes forming the conductive terminals as copper pillar bumps. In yet another method, the method includes the conductive terminals that further comprise copper and each of the conductive terminals has sidewalls covered with copper oxide material.

Although the example embodiments have been described in detail, it should be understood that various changes, substitutions and alterations can be made herein without departing from the spirit and scope of the application as defined by the appended claims. For example, different materials may be utilized for the conductors, the guard rings, the solder balls, the build up layers or different methods of formation may be utilized for the various layers of material. These devices, steps and materials may be varied while remaining within the scope of the appended claims.

Moreover, the scope of the present application is not intended to be limited to the particular embodiments of the process, machine, manufacture, composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the embodiments and alternative embodiments. Accordingly, the appended claims are intended to include within their scope such processes, machines, manufacture, compositions of matter, means, methods, or steps.

What is claimed is:

1. A method, comprising:
    receiving an integrated circuit die having a plurality of conductive terminals extending from a surface of the integrated circuit die, the plurality of conductive terminals disposed on bond pads and providing electrical connection to one or more devices within the integrated circuit die;
    forming solder depositions on the conductive terminals;
    providing a substrate having a die attach region on a surface of the substrate for receiving the integrated circuit die and a protected region outside the die attach region, the substrate having a plurality of conductive traces formed in the die attach region and the conductive traces corresponding to the conductive terminals;
    aligning the integrated circuit die and the substrate and bringing the plurality of conductive terminals and the conductive traces into contact, so that the solder depositions contact the conductive traces; and
    selectively heating the integrated circuit die and the conductive terminals relative to the protected region of the substrate to a temperature sufficient to cause the solder depositions to melt and reflow, forming solder connections between the conductive traces on the substrate and the conductive terminals on the integrated circuit die.

2. The method of claim 1, wherein during the selectively heating, the integrated circuit die reaches a temperature of at least 300 degrees Celsius.

3. The method of claim 2, wherein during the selectively heating, the substrate does not exceed a temperature of 180 degrees Celsius.

4. The method of claim 1, wherein during the selectively heating, infrared energy is applied to the integrated circuit die.

5. The method of claim 1, wherein during the selectively heating, laser energy is applied to the integrated circuit die.

6. The method of claim 1, wherein during the selectively heating, radio frequency energy is applied to the integrated circuit die.

7. The method of claim 1, wherein receiving an integrated circuit die having a plurality of conductive terminals extending from a surface further comprises receiving an integrated circuit die with copper ladder bumps on the bond pads of the integrated circuit die.

8. The method of claim 1, wherein receiving an integrated circuit die having a plurality of conductive terminals extending from a surface further comprises receiving an integrated circuit die having metal pillar bumps on the bond pads of the integrated circuit die.

9. The method of claim 1, wherein providing a substrate having a die attach region on a surface for receiving the integrated circuit die comprises providing the substrate having a plurality of conductive traces formed in the die attach region, and forming cover material over the substrate in the protected region.

10. The method of claim 9, and further comprising disposing a reflective coating over the cover material over the substrate, the reflective coating comprising a metal.

11. A method, comprising:
    providing a substrate core having a plurality of die attach regions on a die side surface each for receiving an integrated circuit, and having regions outside the die attach regions;
    forming conductive traces on the substrate core, the conductive traces exposed in the die attach regions for coupling to conductive terminals of an integrated circuit die to be flip chip mounted in each die attach region;

receiving a plurality of integrated circuit dies, each having a plurality of conductive terminals for flip chip mounting to the substrate core, each conductive terminal having solder deposited on at least an end portion;

aligning an integrated circuit die of the plurality of integrated circuit dies with each die attach region on the substrate, and bringing the solder deposited on the end portion of the conductive terminals into physical contact with the conductive traces; and performing a thermal reflow of the solder deposits by selectively heating the plurality of integrated circuit dies to a temperature sufficient to melt the solder deposits, without heating the substrate above a temperature of 180 degrees Celsius.

12. The method of claim 11, wherein the selectively heating comprises exposing the integrated circuit dies to an energy source selected from the group consisting essentially of infrared, laser, and radio frequency energy sources.

13. The method of claim 11, wherein providing the substrate core having a plurality of die attach regions on the die side surface further comprises providing cover material on the die side surface of the substrate outside of the die attach regions.

14. The method of claim 13, and further comprising providing reflective material on the cover material.

15. The method of claim 14, wherein performing the selectively heating comprises exposing the integrated circuit dies to infrared energy sources.

16. A method, comprising:
forming a solder deposit on an least an end portion of a plurality of conductive terminals of each of a plurality of integrated circuit dies;

providing a substrate having die attach regions for flip chip mounting of the integrated circuit dies to a die side of the substrate, and having conductive traces disposed in the die attach regions and corresponding to the conductive terminals of the integrated circuit dies, and having cover material over the die side of the substrate outside of the die attach regions; and disposing one of the plurality of integrated circuit dies in each die attach region, bringing the solder deposits into contact with the conductive traces and selectively heating the integrated circuit dies to melt the solder deposits, and forming an electrical connection and a physical solder connection between the conductive terminals and the conductive traces.

17. The method of claim 16, wherein selectively heating comprises exposing the integrated circuit dies to an energy source that is one selected from the group consisting essentially of infrared, laser and radio frequency energy sources.

18. The method of claim 16, wherein the conductive terminals comprise copper ladder bumps.

19. The method of claim 16, wherein the conductive terminals comprise copper pillar bumps.

20. The method of claim 16, wherein the conductive terminals further comprise copper and each of the conductive terminals has sidewalls covered with copper oxide material.

* * * * *